United States Patent [19]

Okuda

[11] Patent Number: 5,206,212
[45] Date of Patent: Apr. 27, 1993

[54] FABRICATION OF SUPERCONDUCTING OXIDE FILMS BY LASER ABLATION

[75] Inventor: Shigeru Okuda, Osaka, Japan

[73] Assignee: Sumitomo Electric Industries, Ltd., Osaka, Japan

[21] Appl. No.: 819,588

[22] Filed: Jan. 9, 1992

Related U.S. Application Data

[63] Continuation of Ser. No. 519,716, May 7, 1990, abandoned.

[30] Foreign Application Priority Data

May 19, 1989 [JP] Japan .................................. 1-126847

[51] Int. Cl.$^5$ .......................... B05D 3/06; B05D 5/12
[52] U.S. Cl. ........................................ 505/1; 505/732; 505/730; 505/742; 427/62; 427/596; 427/314
[58] Field of Search ................... 505/1, 732, 730, 742; 427/62, 63, 53.1, 54.1, 314, 596; 219/121.6, 121.82; 204/192.24, 298.23, 298.27, 298.28, 298.29

[56] References Cited

U.S. PATENT DOCUMENTS 4,290,877 9/1981 Blickensderfer ..................... 204/298

FOREIGN PATENT DOCUMENTS 63-262459 10/1988 Japan ............................. 204/298.23

OTHER PUBLICATIONS

Wu et al., "Effect of deposition rate on properties of $YBa_2Cu_3O_{7-\delta}$ superconducting thin films", Appl. Phys. Lett. 56(15) Apr. 1990, pp. 1481–1483.
Lynds et al, "High Tc superconducting thin films prepared by pulsed Nd:YAG laser ablation", AIP No. 165 (Anaheim, Calif.) Nov. 1987 pp. 159–165.
Roas et al, "Epitaxial growth of $YBa_2Cu_3O_{7-x}$ thin films by laser evaporation process," Appl. Phys. Lett. 53(16) Oct. 1988 pp. 1557–1559.
Kanai et al, "Formation of Bi-Sr-Ca-Cu-O Thin films by a laser Sputtering method", Jpn. J. Appl. Phys. 27(7) Jul. 1988 L 1293–1296.
Kwok et al, "Laser evaporation deposition of superconducting and dielectric thin films", Appl. Phys. Lett. 52(21) May 1988 pp. 1825–1827.
Hughes, "Scale-up problems in electron-beam evaporation and sputtering", J. Vac. Sci. Technol. 15(4) Jul.-/Aug. 1978 pp. 1572–1579.
Witanachchi et al, "Deposition of superconducting Y-Ba-Cu-O films at 400° C. without post-annealing", Appl. Phys. Lett. 53(3) Jul. 1988 pp. 234–236.
C. Girault et al., "Influence of Oxygen Pressure on the Characteristics of the FrF–laser-induced Plasma Plume Created Above an YBaCuO Superconducting Target", Applied Physics Letters, vol. 54, No. 15, May 15, 1989, pp. 2033–2037.
O. Aucieilo et al., "Surface Compositional and Topographical Changes Resulting From Excimer Laser Impacting on $YBa_2Cu_3O_7$ Single Phase Superconductor," Applied Physics Letters, vol. 52, No. 3, Jan. 18, 1988, pp. 239–241.

Primary Examiner—Shrive Beck
Assistant Examiner—Roy V. King
Attorney, Agent, or Firm—Pennie & Edmonds

[57] ABSTRACT

A laser beam (2) is applied to a target (1) of an oxide superconductive material, to deposit atoms and/or molecules which are scattered from the target (1) on a first portion (4) of a substrate (3) under an atmosphere containing oxygen for a start. Then, the substrate (3) is moved to deposit atoms and/or molecules scattered from the target (10) on a second portion, which is different form the first portion (4) of the substrate (3), under the atmosphere containing oxygen. At this time, the first portion (4) is subjected to oxygen annealing. These deposition steps are repeated until an oxide superconducting film of a desired thickness is obtained.

2 Claims, 2 Drawing Sheets

FABRICATION OF SUPERCONDUCTING OXIDE FILMS BY LASER ABLATION

This is a continuation of application Ser. No. 07/519,716 filed May 7, 1990, now abandoned.

BACKGROUND OF THE INVENTION

1. Field of the Invention

The present invention relates to a method of fabricating an oxide superconducting film, and more particularly, it relates to a method of fabricating an oxide superconducting film using laser ablation or laser deposition.

2. Description of the Background Art

With recent development of laser units, there has been proposed a laser deposition technique of applying a laser beam to a target for vaporizing or sputtering the target material and forming a film on a substrate (refer to "Saisentan Laser Kako Gijutsu" edited by Hiromichi Kawasumi, CMC Shuppan, for example).

Such a laser deposition technique has the following features:

(1) The film is generally formed at a high speed.
(2) The composition can be easily controlled.

In particular, laser ablation with an excimer pulse laser beam, which has high energy density of at least 0.5 to 1 $J/cm^2$, is highlighted as means for forming an oxide superconducting thin film of Y-Ba-Cu-0, Bi-Sr-Ca-Cu-0 or the like, due to its capability of temperature reduction through photochemical reaction (refer to Appl. Phys. Lett. 53, 517 (1988) by C. C. Chang et al., for example).

It has been proved that the speed of film formation by laser ablation is proportionate to the frequency of a laser beam as used. If the frequency of a laser beam for forming an oxide superconducting film of Y-Ba-Cu-O, Bi-Sr-Ca-Cu-0 or the like is simply increased, however, it is difficult to incorporate oxygen, which must be contained in such an oxide superconducting film, since the speed of film formation is too high. When an oxide superconductor contains insufficient oxygen, its critical temperature $T_C$ is reduced. Thus, it is inexpedient to increase the frequency of the laser beam in order to simply improve the speed of film formation.

In more concrete terms, it is possible to form a Y-Ba-Cu-0 film of about 1 to 2 Å in thickness every pulse by laser ablation with an ArF gas laser, for example. Thus, a film of 18000 Å to 36000 Å in thickness can be formed per hour with a laser beam of 5 Hz, for example. However, if a film is formed with a laser beam of 10 Hz, for example, sufficient oxygen cannot be incorporated into the as-formed oxide superconducting film since the speed of film formation is too high, although the amount of film formation is theoretically doubled per unit time.

SUMMARY OF THE INVENTION

Accordingly, an object of the present invention is to provide a method of fabricating an oxide superconducting film, which can incorporate sufficient oxygen even under a high speed of film formation.

In order to solve the aforementioned technical problem, the inventive method of fabricating an oxide superconducting film comprise:

a. a first deposition step of applying a laser beam to a target of an oxide superconductive material for depositing atoms and/or molecules scattered from the target on a first portion of a substrate under an atmosphere containing oxygen; and b. a second deposition step of moving the substrate for depositing atoms and/or molecules scattered from the target on a second portion, which is different from the first portion of the substrate, under the atmosphere containing oxygen, and c. the first and second deposition steps are repeated.

Referring to FIG. 1 in more concrete terms, when a laser beam 2 is applied to a target 1, film formation is performed on a first portion 4 of a substrate 3, which is opposed to the target 1. Such film formation is carried out under an atmosphere containing oxygen. The substrate 3 is movable along arrows 5, 6, 7 and 8. Therefore, when the substrate 3 is moved any direction, subsequent film formation is performed on a second portion which is different form the first portion 4 of the substrate 3. At this time, oxygen annealing is carried out on the first portion 4, which has been subjected to the film formation, of the substrate 3 under the atmosphere containing oxygen, so that sufficient oxygen can be incorporated into the as-formed oxide superconducting film. Such deposition and oxygen annealing are alternately repeated until an oxide superconducting film having a desired thickness is obtained.

According to the present invention, the frequency of the laser beam is preferably selected to be at least 10 Hz.

Heretofore, the frequency of a laser beam has been generally reduced below 10 Hz, in order to form an oxide superconducting film of Y-Ba-Cu-0 or Bi-Sr-Ca-Cu-0 through laser ablation. In general, however, the frequency of such a laser beam can be raised up to 60 Hz to 100 Hz, and it is desirable to increase the laser beam frequency in order to sufficiently effectuate the ability of the laser unit and to increase the amount of film formation per unit time.

According to the present invention, the substrate is moved after a portion thereof is subjected to film formation of 50 Å for example, to newly perform film formation on another portion, while the portion previously subjected to film formation is oxygen-annealed to enable incorporation of sufficient oxygen. Thus, it is possible to use a laser beam having a frequency of at least 10 Hz, for example, thereby sufficiently effectuating the ability of the laser unit.

According to the present invention, therefore, it is possible to form an oxide superconducting film at a high speed using a high-frequency laser beam, without damaging superconducting properties. Thus, the present invention is particularly advantageously employed for the field of a magnetic shield, a superconducting wire rod or the like, which requires formation of a large amount of superconducting films.

These and other objects, features, aspects and advantages of the present invention will become more apparent from the following detailed description of the present invention when taken in conjunction with the accompanying drawings.

DESCRIPTION OF THE PREFERRED EMBODIMENTS

Before describing Example of the present invention, the following reference example is presented:

REFERENCE EXAMPLE

Figure 2:
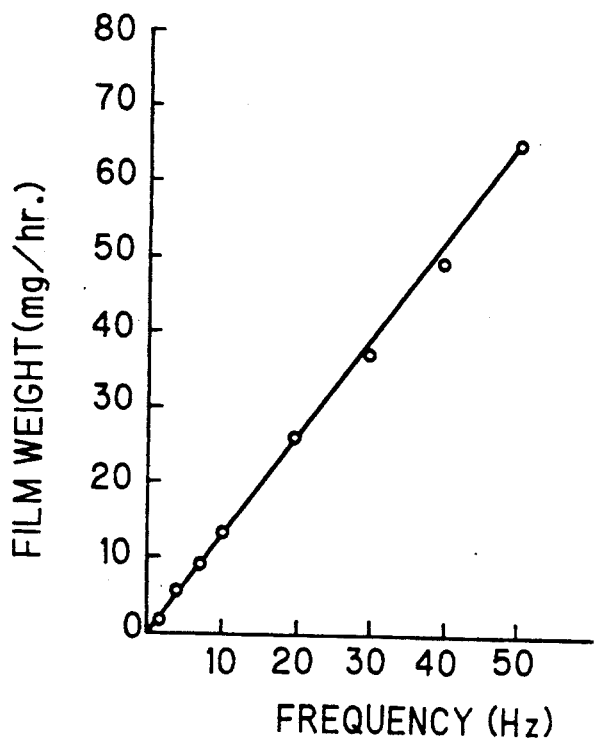
FIG. 2 illustrates relation between laser beam frequency and film weight.
Figure 3:
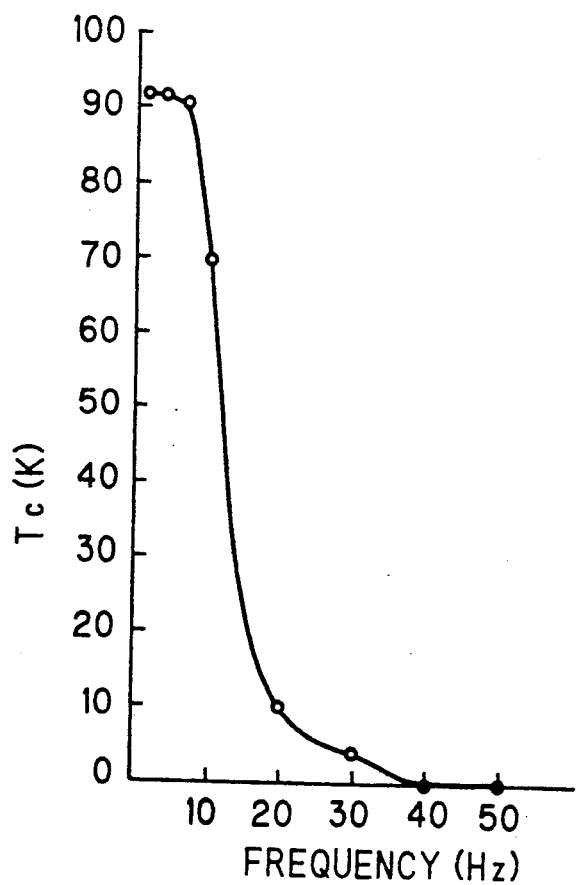
FIG. 3 illustrates relation between laser beam frequency and critical temperature $T_C$.

A target of $Y_1Ba_2Cu_3O_{6.9}$ was used to perform laser deposition with an ArF gas laser under an atmosphere having oxygen pressure of 200 mTorr. An MgO substrate was employed with a target-to-substrate distance of 40 mm and a substrate temperature of 700° C. The frequency of a laser beam having energy density of 1 J/pulse was varied within a range of 1 Hz to 50 Hz, to carry out one-hour film formation at some frequency levels within this range. FIGS. 2 and 3 show values of film weight and critical temperature $T_C$ thus obtained.

The film weight is increased with the frequency level as understood from FIG. 2, while the critical temperature $T_C$ of the as-formed superconducting film falls below 77 K at frequency levels exceeding 10 Hz as shown in FIG. 3, to result in no superconduction of the film in liquid nitrogen.

Example of the present invention is now described.

EXAMPLE

Figure 1:
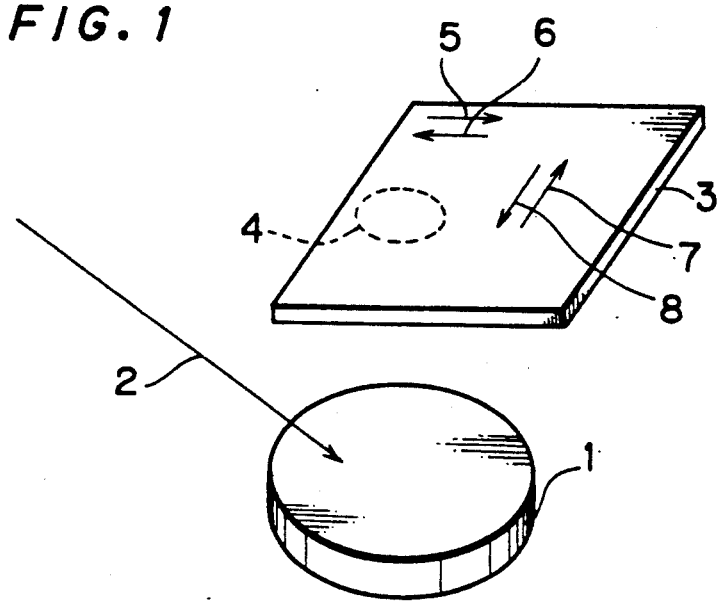
FIG. 1 is a perspective view illustrating the principle of the inventive method of fabricating an oxide superconducting film.
Figure 4:
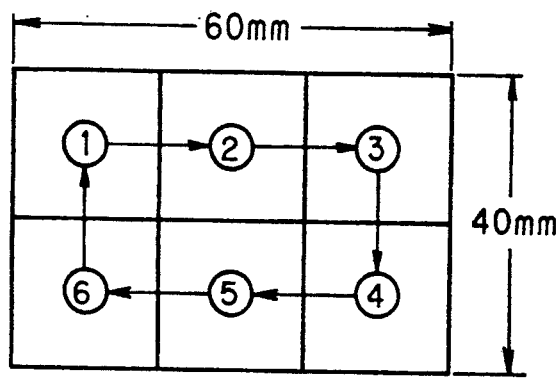
FIG. 4 is an plan view illustrating an exemplary mode of movement of film forming regions achieved by moving a substrate in Example of the present invention.

Example of the present invention was prepared with a target material, a laser, an atmosphere containing oxygen, a substrate material, a substrate temperature and a target-to-substrate distance which were similar to those of the aforementioned reference example. As shown in FIG. 4, the size of the substrate was 60 mm×40 mm, and film forming regions were moved every second as ①→②→③④→⑤→⑥→①...Energy density of the laser beam was 1 J/pulse similarly to the reference example, while its frequency was 40 Hz.

The film weight measured after one-hour film formation was 52 mg, and critical temperature $T_C$ was 90 K.

Comparing Example with the reference example, it is understood that the critical temperature of the reference example fell below 4.2 K at the laser beam frequency of 40 Hz to exhibit no superconduction in liquid nitrogen, although its film weight was substantially identical to that of Example. According to Example, on the other hand, it is possible to attain a high critical temperature $T_C$ since sufficient oxygen can be simultaneously incorporated into remaining portions when film formation is performed on a certain portion.

Although the present invention has been described and illustrated in detail, it is clearly understood that the same is by way of illustration and example only and is not to be taken by way of limitation, the scope of the present invention being limited only by the terms of the appended claims.

I claim:

1. A method of fabricating an oxide superconducting film comprising the steps of:
    (a) applying a laser beam to a target of an oxide superconducting material and depositing atoms and/or molecules scattered from said target on a portion of a heated substrate under an atmosphere containing oxygen;
    (b) moving said heated substrate
        (i) along a plurality of straight lines parallel to each other; and
        (ii) along at least one other line in a direction vertical to said plurality of straight lines parallel to each other for depositing atoms and/or molecules scattered from said target under said atmosphere containing oxygen so that said heated substrate is deposited with an area of said oxide superconducting film;
    (c) applying said laser beam to said target of said oxide superconducting material and depositing atoms and/or molecules scattered from said target to a portion of said heated substrate on which said atoms and/or molecules from said target were previously deposited;
    (d) moving said heated substrate
        (i) along a plurality of straight lines parallel to each other; and
        (ii) along at least one other line in a direction vertical to said plurality of straight lines parallel to each other for depositing atoms and/or molecules scattered from said target under said atmosphere containing oxygen so that said area of said of said oxide superconducting film is deposited at least in part with another layer of said oxide superconducting film;
    (e) repeating steps (c) and (d) until a final thickness of said oxide superconducting film is obtained over an area at said substrate.

2. A method of fabricating an oxide superconducting film in accordance with claim 1, wherein the frequency of said laser beam is at least 10 Hz.

* * * * *